(12) United States Patent
Kumano

(10) Patent No.: US 10,529,766 B2
(45) Date of Patent: Jan. 7, 2020

(54) CAMERA AND SOLID-STATE IMAGE SENSOR THAT INCLUDES A WIRING STRUCTURE WITH AN ELECTRICALLY CONDUCTIVE PATTERN HAVING PLURAL PRIMARY AND AUXILIARY LINES ARRANGED ON A SEMICONDUCTOR SUBSTRATE

(71) Applicant: CANON KABUSHIKI KAISHA, Tokyo (JP)

(72) Inventor: Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 61 days.

(21) Appl. No.: 15/954,763

(22) Filed: Apr. 17, 2018

(65) Prior Publication Data

US 2018/0308892 A1    Oct. 25, 2018

(30) Foreign Application Priority Data

Apr. 24, 2017  (JP) ................................ 2017-085612

(51) Int. Cl.
   *H01L 27/146*   (2006.01)
   *H04N 5/369*    (2011.01)
(52) U.S. Cl.
   CPC .. *H01L 27/14636* (2013.01); *H01L 27/14625* (2013.01); *H01L 27/14643* (2013.01); *H01L 27/14685* (2013.01); *H04N 5/369* (2013.01)

(58) Field of Classification Search
   CPC ......... H01L 27/14636; H01L 27/14625; H01L 27/14685; H01L 27/14643; H01L 27/14641; H01L 27/14629; H04N 5/369; H04N 5/335

See application file for complete search history.

(56) References Cited

U.S. PATENT DOCUMENTS

| 8,471,196 | B2 * | 6/2013 | Kumano | ........... H01L 27/14623 250/208.1 |
| 8,970,769 | B2 | 3/2015 | Shinohara et al. | |
| 9,659,991 | B2 | 5/2017 | Kumano | |
| 2002/0039801 | A1 | 4/2002 | Ishii | |

(Continued)

FOREIGN PATENT DOCUMENTS

| JP | H10-303304 A | 11/1998 |
| JP | 2002-110731 A | 4/2002 |

(Continued)

*Primary Examiner* — Twyler L Haskins
*Assistant Examiner* — Akshay Trehan
(74) *Attorney, Agent, or Firm* — Venable LLP

(57) ABSTRACT

A solid-state image sensor includes semiconductor substrate having element forming pixel array and element forming peripheral circuit, and wiring structure. The wiring structure includes electrically conductive pattern arranged in trench of interlayer insulation film and includes primary lines parallel to first direction and auxiliary lines connecting the primary lines. Width of primary line in second direction perpendicular to the first direction is not less than 250 nm and not more than 2,000 nm, interval between adjacent primary lines is not more than 500 nm, width of the auxiliary line in the first direction is less than 400 nm. Value obtained by dividing area of the electrically conductive pattern in square region by area of the square region is not more than 0.9.

23 Claims, 11 Drawing Sheets

(56) References Cited

U.S. PATENT DOCUMENTS

| | | | | |
|---|---|---|---|---|
| 2004/0202847 | A1* | 10/2004 | Yoshie | H01L 21/3212 428/209 |
| 2005/0012166 | A1* | 1/2005 | Choi | H01L 27/14621 257/414 |
| 2006/0141653 | A1* | 6/2006 | Choi | H01L 27/14621 438/48 |
| 2007/0136715 | A1 | 6/2007 | Ishikawa | |
| 2009/0298220 | A1* | 12/2009 | Anderson | H01L 27/14636 438/70 |
| 2010/0327383 | A1* | 12/2010 | Hayasaki | H01L 21/76898 257/432 |
| 2011/0143485 | A1* | 6/2011 | Tazoe | H01L 27/14627 438/72 |
| 2011/0175232 | A1* | 7/2011 | Ota | H01L 24/05 257/774 |
| 2011/0248387 | A1 | 10/2011 | Kamon | |
| 2013/0062777 | A1* | 3/2013 | Ogata | H01L 24/05 257/774 |
| 2014/0145338 | A1* | 5/2014 | Fujii | H01L 23/522 257/762 |
| 2015/0179691 | A1* | 6/2015 | Yanagita | H01L 27/14634 257/292 |
| 2015/0255495 | A1* | 9/2015 | Park | H01L 27/1462 257/432 |
| 2016/0351499 | A1 | 12/2016 | Kitada | |
| 2017/0040253 | A1* | 2/2017 | Kim | G02F 1/13 |
| 2017/0170230 | A1 | 6/2017 | Kumano | |
| 2017/0200757 | A1* | 7/2017 | Ihara | H01L 27/14634 |
| 2018/0047768 | A1 | 2/2018 | Suzuki et al. | |

FOREIGN PATENT DOCUMENTS

| | | |
|---|---|---|
| JP | 2002-334883 A | 11/2002 |
| JP | 2004-063702 A | 2/2004 |
| JP | 2007-165487 A | 6/2007 |
| JP | 2007-180110 A | 7/2007 |
| JP | 2008-235922 A | 10/2008 |
| JP | 2009-259967 A | 11/2009 |
| JP | 2011-009645 A | 1/2011 |
| JP | 2011-146563 A | 7/2011 |
| JP | 2011-222872 A | 11/2011 |
| JP | 2012-244101 A | 12/2012 |
| JP | 2013-058584 A | 3/2013 |
| JP | 2016-219689 A | 12/2016 |

* cited by examiner

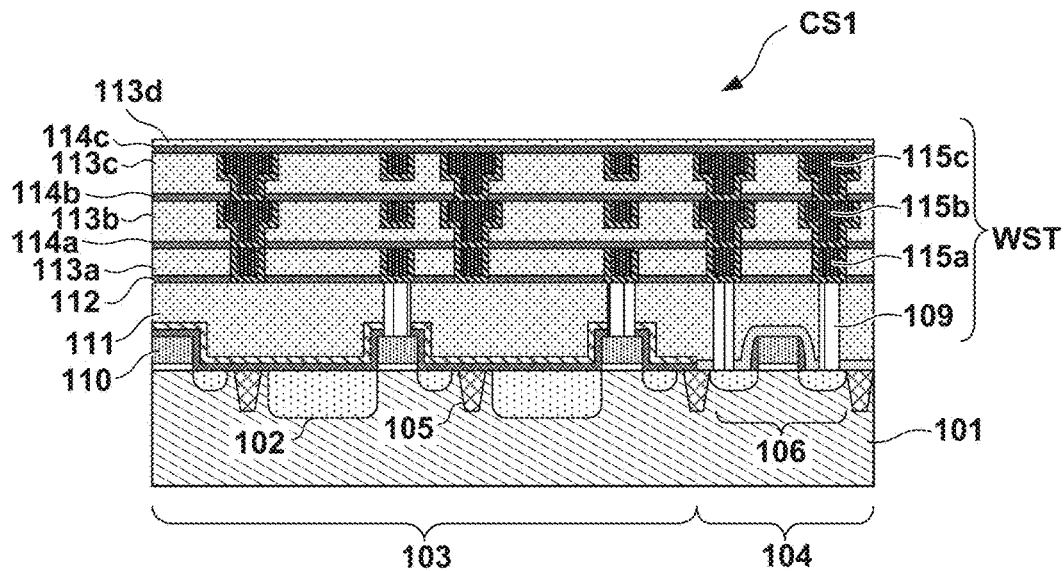
FIG. 4A
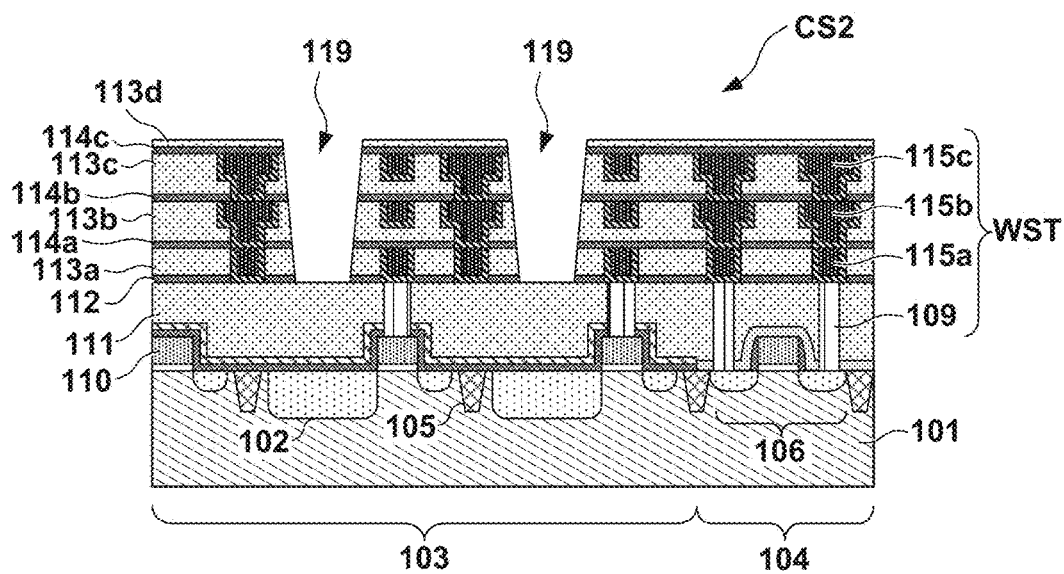

CAMERA AND SOLID-STATE IMAGE SENSOR THAT INCLUDES A WIRING STRUCTURE WITH AN ELECTRICALLY CONDUCTIVE PATTERN HAVING PLURAL PRIMARY AND AUXILIARY LINES ARRANGED ON A SEMICONDUCTOR SUBSTRATE

BACKGROUND OF THE INVENTION

Field of the Invention

The present invention relates to a solid-state image sensor and a camera.

Description of the Related Art

In accordance with the increase in the pixel count of a solid-state image sensor, it has become important to reduce the signal delay time in a signal line. Accordingly, a material that mainly contains copper is frequently used as a material for a wiring layer. Other than the signal line, a power supply line and a ground line can also be arranged in a single wiring layer. Hence, in addition to the signal line, the power supply line and the ground line can also be made of a material mainly containing copper. In order to form patterns such as the signal line, the power supply line, and the ground line by using the material mainly containing copper, a damascene process can be used. As it is well known, the damascene process is a process of forming a trench in an interlayer insulation film, forming a film made of a wiring material so as to fill the trench with the wiring material, and subsequently performing a CMP process to remove an unnecessary portion of the film.

In the solid-state image sensor, voltage drops in the power supply line and the ground line need to be reduced in order to reduce fixed pattern noise, and thus the pattern widths of the power supply line and the ground line, respectively, need to be increased. Alternatively, it may also be required to reduce a voltage drop in the signal line for transferring a signal and the like.

If a pattern width is increased, dishing can occur in the CMP process. Since the CMP process of a wiring layer material is performed under a condition in which the polishing rate of the wiring material is higher than the polishing rate of an insulation material, the polishing rate of a region which has a large pattern width is higher than that of a region which has a small pattern width, and a dent is formed in the region which has the large pattern width due to excessive polishing of the wiring material (see Japanese Patent Laid-Open No. 2009-259967). This phenomenon is called dishing. As a technique for reducing dishing, a plurality of slits may be provided so as to form broken lines on a wide pattern.

However, if a plurality of slits are provided so as to form broken lines on a wide pattern, the adhesiveness (bonding force) between the pattern and a film to be formed on the pattern is reduced, and it can cause the film to peel from the pattern more easily. The reliability of the solid-state image sensor is reduced when film peeling occurs. The reduction in reliability can influence the reduction in yield.

SUMMARY OF THE INVENTION

The present invention provides a technique advantageous in improving the reliability of a solid-state image sensor that includes a structure in which an electrically conductive pattern is arranged in a trench of an interlayer insulation film.

One of aspects of the present invention provides a solid-state image sensor that includes a pixel array having a plurality of pixels, and a peripheral circuit which is arranged on the periphery of the pixel array, the sensor comprising: a semiconductor substrate that includes an element forming the pixel array and an element forming the peripheral circuit; and a wiring structure that is arranged on the semiconductor substrate, wherein the wiring structure includes an electrically conductive pattern arranged in a trench of an interlayer insulation film, the electrically conductive pattern includes a plurality of primary lines parallel to a first direction and a plurality of auxiliary lines connecting the plurality of primary lines to each other, a width of each of the plurality of primary lines in a second direction perpendicular to the first direction is not less than 250 nm and not more than 2,000 nm, an interval between adjacent primary lines of the plurality of primary lines is not more than 500 nm, a width of each of the plurality of auxiliary lines in the first direction is less than 400 nm, the plurality of primary lines include a first line, a second line, and a third line which is arranged between the first line and the second line, a square region, having a first side which is parallel to the first direction and overlaps the first line and a second side which is parallel to the first direction and overlaps the second line, is defined so as to include at least one of the plurality of auxiliary lines in the square region, and a value obtained by dividing an area of the electrically conductive pattern in the square region by an area of the square region is not more than 0.9.

Further features of the present invention will become apparent from the following description of exemplary embodiments with reference to the attached drawings.

BRIEF DESCRIPTION OF THE DRAWINGS

FIG. 4A is a schematic sectional view showing a structure and a manufacturing method of the solid-state image sensor;

DESCRIPTION OF THE EMBODIMENTS

Exemplary embodiments of the present invention will be described below with reference to the accompanying drawings. The embodiments are particularly suitable for a front-side illumination solid-state image sensor that includes a light waveguide (to be described below), but are also applicable to a front-side illumination solid-state image sensor that does not include the light waveguide. The embodiments are also applicable to a back-side illumination solid-state image sensor.

Figure 1:
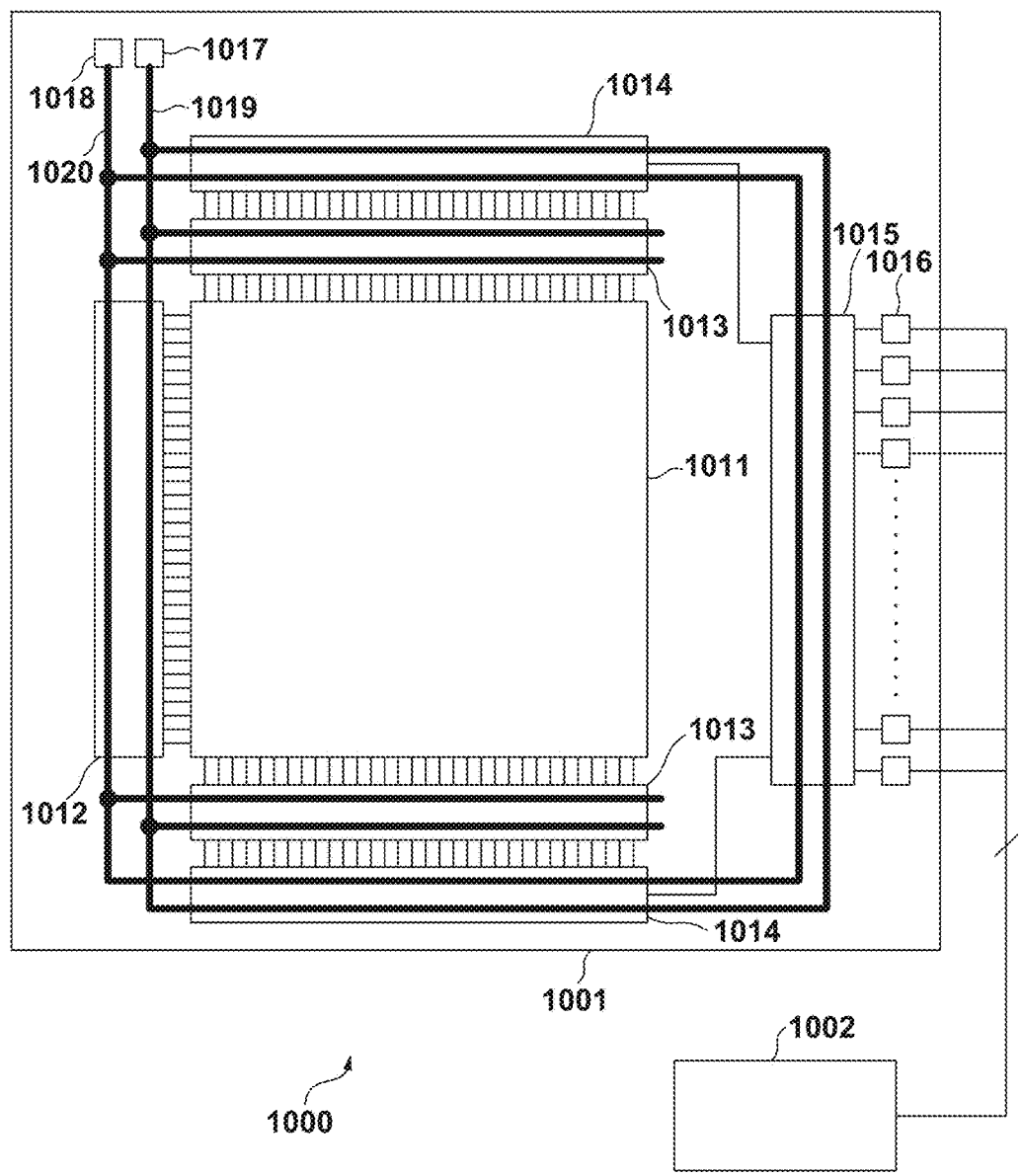
FIG. 1 is a view showing a camera and the arrangement of a solid-state image sensor that forms the camera according to an embodiment of the present invention.

First, matters common to the first to third embodiments (to be described later) will be described. FIG. 1 shows the arrangement of a camera 1000 according to one embodiment of the present invention. The concept of a camera includes not only a device whose primary purpose is image capturing but also a device (for example, a personal computer or a mobile terminal) that includes an image capturing function in an auxiliary manner. The camera 1000 includes a solid-state image sensor 1001 and a processor 1002 that processes a signal output from the solid-state image sensor 1001. The solid-state image sensor 1001 can include a pixel array 1011, a row selection circuit (for example, a vertical scanning circuit) 1012, readout circuits 1013, column selection circuits (for example, horizontal scanning circuits) 1014, and an output circuit 1015. The pixel array 1011 includes a plurality of pixels arranged so as to form a plurality of rows and a plurality of columns. The readout circuits 1013 each include a plurality of column circuits, and the plurality of column circuits read out, via a plurality of column signal lines of the pixel array 1011, signals from pixels selected by the row selection circuit 1012. Each column circuit can include, for example, an amplifier, a CDS circuit, an operation circuit, an AD converter, and the like. The column selection circuits 1014 each sequentially transfer, to the output circuit 1015, a signal read out by the corresponding readout circuit 1013 from the plurality of pixels selected by the row selection circuit 1012 in the pixel array 1011. In the example shown in FIG. 1, a pair of the readout circuit 1013 and the column selection circuit 1014 is arranged on one side of the pixel array 1011, and another pair of the readout circuit 1013 and the column selection circuit 1014 is arranged on the other side of the pixel array 1011. The output circuit 1015 can include, for example, a plurality of output buffers.

The solid-state image sensor 1001 can further include a plurality of output pads 1016 that output signals from the plurality of output buffers forming the output circuit 1015, a power supply voltage pad 1017, a ground voltage pad 1018, a power supply voltage line 1019, and a ground voltage line 1020. The power supply voltage line 1019 is connected to the power supply voltage pad 1017 and supplies a power supply voltage to the pixel array 1011, the row selection circuit 1012, the readout circuits 1013, the column selection circuits 1014, and the output circuit 1015. The power supply voltage pad 1017 and the power supply voltage line 1019 can be divided into a plurality of systems. The ground voltage line 1020 is connected to the ground voltage pad 1018 and supplies a ground voltage to the pixel array 1011, the row selection circuit 1012, the readout circuits 1013, the column selection circuits 1014, and the output circuit 1015.

Figure 2:
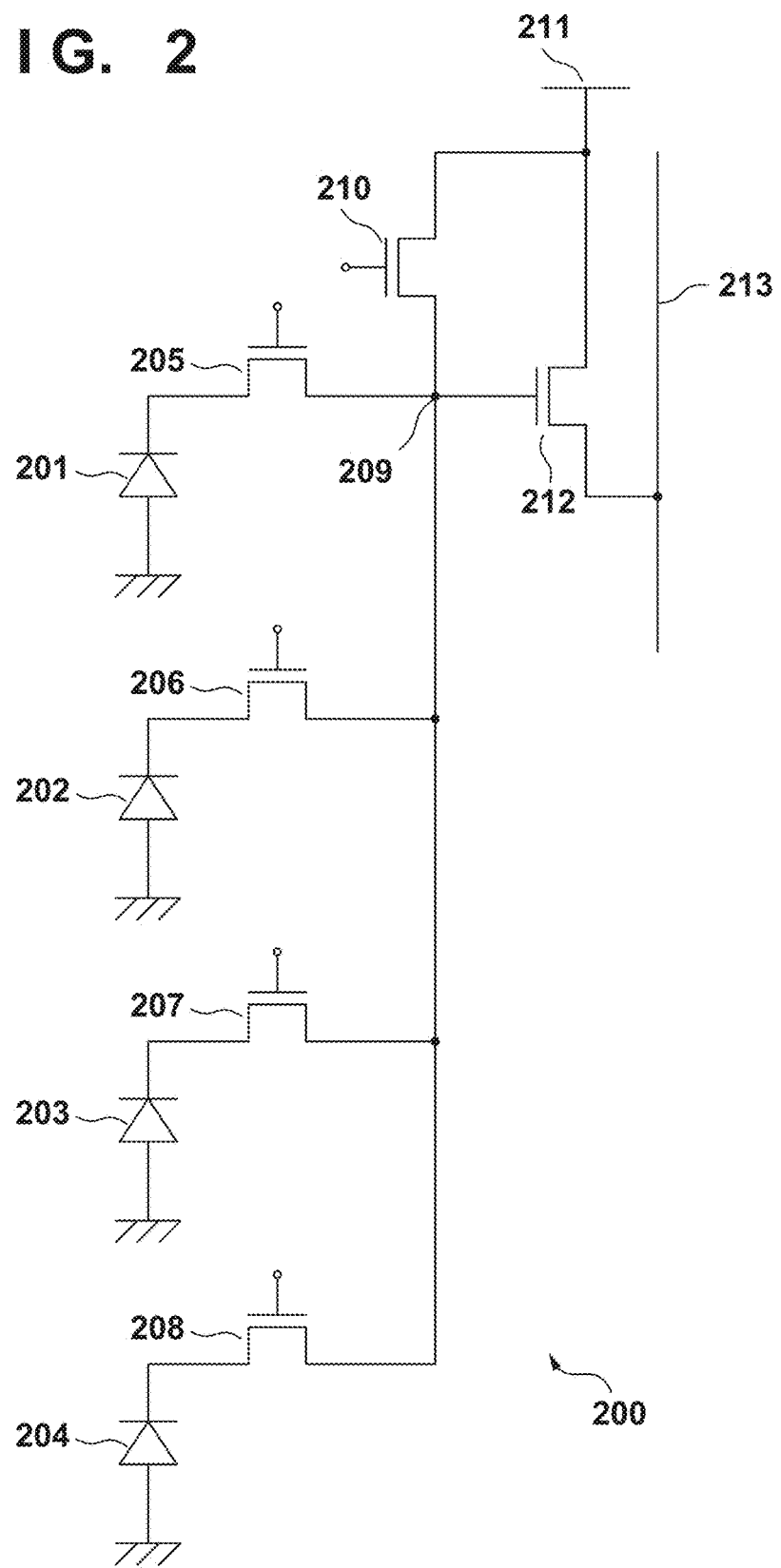
FIG. 2 is a view showing an example of the arrangement of a pixel that forms a pixel array.

FIG. 2 shows an example of the arrangement of a pixel that forms the pixel array 1011. The pixel is a component that includes one or a plurality of photoelectric converters. Typically, a pixel can be formed from photoelectric converters that share a microlens. For example, if there is one photoelectric converter arranged for one microlens, a pixel can be formed from one photoelectric converter. Also, if there are two photoelectric converters arranged for one microlens, a pixel can be formed from two photoelectric converters.

In the example shown in FIG. 2, a pixel cell 200 is formed from four photoelectric converters 201, 202, 203, and 204, four transfer transistors 205, 206, 207, and 208, one reset transistor 210, and one amplification transistor 212. Here, one pixel cell 200 may form four pixels, two pixels, or one pixel. The pixel cell 200 can include a charge-voltage converter 209. The charge-voltage converter 209 can include a floating diffusion. The photoelectric converters 201, 202, 203, and 204 generate and accumulate charges in accordance with the amount of incident light. The transfer transistors 205, 206, 207, and 208, transfer the charges accumulated in the photoelectric converters 201, 202, 203, and 204, respectively, to the charge-voltage converter 209.

The components (the row selection circuit 1012, the readout circuits 1013, the column selection circuits 1014, the output circuit 1015, the output pads 1016, the power supply voltage pad 1017, and the ground voltage pad 1018 in the example of FIG. 1) other than the pixel array 1011 form a peripheral circuit.

In the example shown in FIG. 2, each of the photoelectric converters 201, 202, 203, and 204 is formed from a photodiode whose anode is connected to the ground voltage line and whose cathode is connected to a corresponding one of the transfer transistors 205, 206, 207, and 208. The charge-voltage converter 209 is connected to the gate of the amplification transistor 212. The drain of the amplification transistor 212 is connected to a power supply line 211, and the source of the amplification transistor 212 is connected to a column signal line 213. The amplification transistor 212 outputs, to the column signal line 213, a voltage corresponding to a voltage applied to the gate. The column signal line 213 is connected to the column circuits of the aforementioned readout circuits 1013. The drain of the reset transistor 210 is connected to the power supply line 211, and the source of the reset transistor is connected to the charge-voltage converter 209 to set the voltage of the charge-voltage converter 209. A first voltage and a second voltage can be selectively supplied to the power supply line 211. When the reset transistor 210 is set to a conductive state in a state in which the first voltage is supplied to the power supply line 211, the pixel cell 200 is set to a selected state in which the amplification transistor 212 can drive the column signal line 213. When the reset transistor 210 is set to a conductive state in a state in which the second voltage is supplied to the power supply line 211, the pixel cell 200 is set to an unselected state in which the amplification transistor 212 cannot drive the column signal line 213.

Figure 3A:
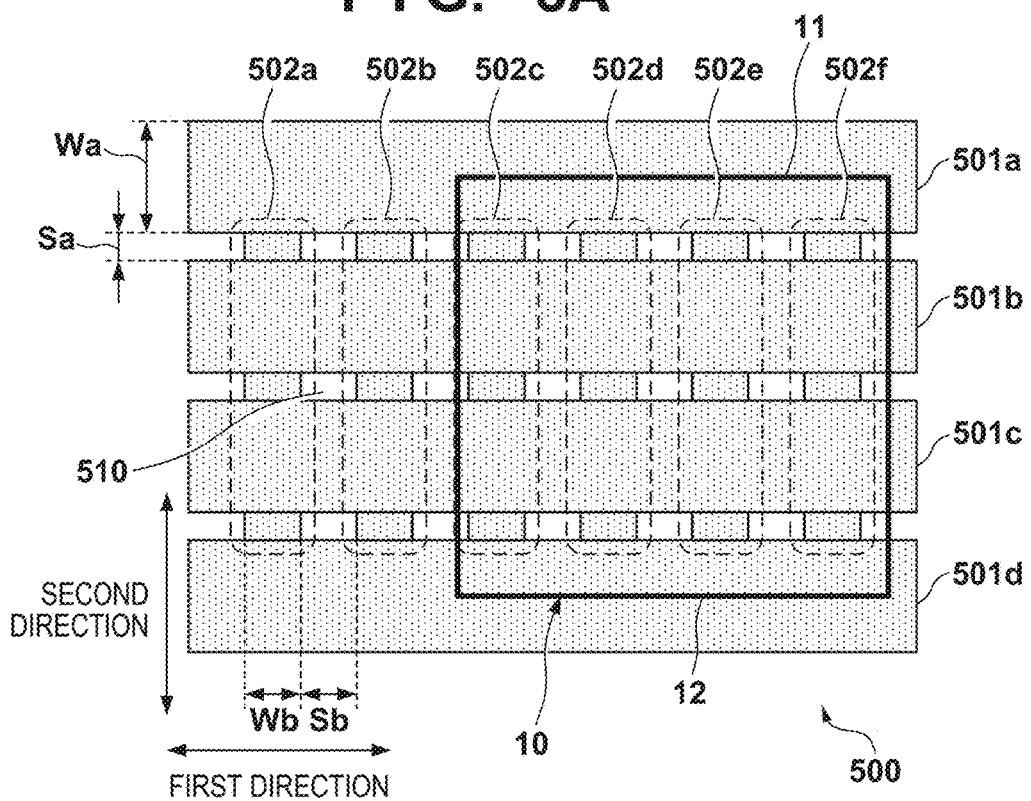
FIG. 3A is a view schematically showing an electrically conductive pattern that can be arranged in the solid-state image sensor.

FIG. 3A schematically shows an electrically conductive pattern 500 that can be arranged on the solid-state image sensor 1001. The electrically conductive pattern 500 can be a pattern to which a fixed voltage (for example, the power supply voltage or the ground voltage) is applied. For example, the power supply voltage line 1019 and the ground voltage line 1020 described above can be formed by the electrically conductive pattern 500 schematically shown in FIG. 3A. The signal line can be formed from the electrically conductive pattern 500. A line arranged on the pixel array can be formed from the electrically conductive pattern 500. Note that, for the sake of descriptive convenience, FIG. 3A shows a partial cutout of the entire electrically conductive pattern 500. In one example, the number of primary lines 501 forming the electrically conductive pattern 500 is 8 to 16 and can be, for example, 12.

A first direction and a second direction perpendicular to each other will be used as a reference in the description hereinafter. However, these expressions are merely for the descriptive convenience of the component structure and dimension of the electrically conductive pattern 500 and do not limit the direction in which the electrically conductive pattern 500 is arranged in the solid-state image sensor 1001.

The electrically conductive pattern 500 is arranged in an interlayer insulation film trench in a wiring structure arranged on a semiconductor substrate. The electrically conductive pattern 500 includes the plurality of primary lines 501 parallel to the first direction and a plurality of auxiliary lines 502 connecting the plurality of primary lines 501 to each other. Here, reference numerals 501a, 501b, 501c, and 501d denote the primary lines 501, respectively, when they are to be described separately from each other. Also, reference numerals 502a, 502b, 502c, 502d, 502e, and 502f denote the plurality of auxiliary lines 502, respectively, when they are to be described separately from each other.

Assume that a reference symbol Wa indicates the width of each primary line 501 in the second direction, and that a reference symbol Wb indicates the width of each auxiliary line 502 in the first direction hereinafter. Also, assume that reference symbol Sa indicates the interval between adjacent primary lines 501 (for example, the interval between the primary line 501a and the primary line 501b), and that reference symbol Sb indicates the interval between adjacent auxiliary lines 502 (for example, the interval between the auxiliary line 502a and the auxiliary line 502b). By arranging the plurality of auxiliary lines 502 between the adjacent primary lines 501, a plurality of slits 510 arranged so as to form broken lines are formed.

The structure and the manufacturing method of the solid-state image sensor 1001 will be described below with reference to FIGS. 4A to 4D. The solid-state image sensor 1001 includes a pixel array 103 (corresponding to the aforementioned pixel array 1011) which includes a plurality of pixels and a peripheral circuit 104 which is arranged on the periphery of the pixel array 103. The solid-state image sensor 1001 includes a semiconductor substrate 101 and a wiring structure WST arranged on the semiconductor substrate 101.

A sectional view CS1 schematically shows a state in which the wiring structure WST is formed on the semiconductor substrate 101. The semiconductor substrate 101 includes elements (for example, photoelectric converters 102 (corresponding to the aforementioned photoelectric converters 201 to 204)) forming the pixel array 103 and elements (for example, a transistor 106) forming the peripheral circuit 104. The semiconductor substrate 101 includes element isolation portions 105. The wiring structure WST can include gates 110 each arranged on the semiconductor substrate 101 via gate insulation films, an interlayer insulation film 111 arranged on the gates 110, and contact plugs 109 embedded in the interlayer insulation film 111. Each contact plug 109 is made of a material mainly containing, for example, tungsten, and a barrier metal made of titanium or titanium nitride can be arranged between the contact plug 109 and the interlayer insulation film 111 or the like.

The wiring structure WST can further include an etching stop film 112, a plurality of wiring layers 115, a plurality of interlayer insulation films 113, and a plurality of diffusion preventive films 114. The etching stop film 112 can be used when forming a light waveguide (to be described later). Reference numerals 115a to 115c denote the plurality of wiring layers, respectively, when they are to be described separately from each other. Reference numerals 113a to 113d denote the plurality of interlayer insulation films 113, respectively, when they are to be described separately from each other. Reference numerals 114a to 114c denote the plurality of diffusion preventive films 114, respectively, when they are to be described separately from each other. The etching stop film 112 can be used when forming the light waveguide (to be described later).

The wiring layers 115 can include an electrically conductive pattern that can be formed by forming trenches in the interlayer insulation films 113, forming a film made of an electrically conductive material (for example, a material mainly containing copper) so as to fill each trench, and subsequently removing the films on the respective interlayer insulation films 113 by a CMP process. A barrier metal layer can be formed between each trench and the electrically conductive pattern. The barrier metal layer can include a layer made of, for example, one of titanium, tantalum, and tantalum nitride.

The diffusion preventive films 114 has a function of preventing the diffusion of metal atoms (copper atoms) forming the electrically conductive material in the interlayer insulation films 113. In a case in which the refractive index of the diffusion preventive films 114 is high, light can propagate through the diffusion preventive films 114 and cause color mixture and a reduction in sensitivity. Hence, it is preferable for the diffusion preventive films 114 to have a low refractive index, preferably a refractive index of 1.9 or less. Each of the diffusion preventive films 114 can be a layer that contains, for example, at least one of silicon carbide (SiC) and silicon oxycarbide (SiOC). The interlayer insulation film 113d can be formed on the diffusion preventive film 114c. The interlayer insulation film 113d can be a film that contains, for example, at least one of silicon oxide (SiO) and silicon oxycarbide (SiOC). In order to improve the condensing rate, the interlayer insulation film 113d is preferably thin and has, for example, a thickness of 500 nm or less. However, for stress reduction, each of the interlayer insulation films 113 can have, for example, a thickness of 100 nm or more.

A sectional view CS2 shows a process in which openings 119 for forming the light waveguides are formed in the wiring structure WST. Each opening 119 is arranged above the photoelectric converter 102. A sectional view CS3 shows a process in which the openings 119 are filled with a light waveguide material 116. The light waveguide material 116 can be, for example, silicon nitride or silicon oxide. A film made of the light waveguide material 116 and formed on the wiring structure WST can have, for example, a high compressive stress of about 100 MPa to 600 MPa. In one example, in order to completely fill the opening 119 with the light waveguide material 116, the film made of the light waveguide material 116 is required to have a thickness of about 2 μm. This can generate a high compressive stress.

The wiring layer 115c in the peripheral circuit 104 can have the electrically conductive pattern 500 as exemplified in FIG. 3A. On the electrically conductive pattern 500 of the wiring layer 115c, the diffusion preventive film 114c and the interlayer insulation film 113d can be formed. Also, a film made from the light waveguide material 116 and having a high compressive stress can be arranged on the diffusion preventive film 114c via the interlayer insulation film 113d. Hence, the diffusion preventive film 114c is influenced by the high compressive stress of the film made from the light waveguide material 116. Therefore, as exemplified in a sectional view CS4, a shearing force is generated on the interface between the diffusion preventive film 114c and the electrically conductive pattern 500 arranged on the wiring layer 115c, and the diffusion preventive film 114c can peel from the electrically conductive pattern 500 arranged on the wiring layer 115c and the interlayer insulation film 113c. Note that even in a case in which the peeling of the diffusion preventive film 114c does not occur, the adhesiveness of the diffusion preventive film 114c to the electrically conductive pattern 500 arranged on the wiring layer 115c and the interlayer insulation film 113c can degrade, and this can subsequently cause the diffusion preventive film 114c to peel. Although the diffusion preventive film 114 which is most likely to peel has been exemplified here, the diffusion preventive film 114a can also peel from the wiring layer 115a, and the diffusion preventive film 114b can peel from the wiring layer 115b. In order to prevent such occurrence of peeling, restrictions and design rules (to be described later) can be applied to the arrangement of the electrically conductive pattern 500.

A subsequent processes of a case in which the peeling of the diffusion preventive films 114 is prevented by complying with the restrictions and the design rules (to be described later) will be described below. A sectional view CS5 shows a process in which the film made of the light waveguide material 116 is planarized and patterned. First, the film made of the light waveguide material 116 is planarized by a CMP process. Next, the film made of the light waveguide material 116 on the peripheral circuit 104 is removed by etching. As a result, light waveguides WG and a portion CP extending from the light waveguides WG can be formed. The portion CP is made from the same material as the light waveguides WG and connects the plurality of light waveguides WG to each other.

A sectional view CS6 shows a process in which an interlayer insulation film 113e, a plug 120, an electrically conductive film 130, and microlenses 150 are formed. First, the interlayer insulation film 113e is formed, a via hole is formed on the interlayer insulation film 113e, and the plug 120 is formed by filling the via hole with an electrically conductive material. The plug 120 can be formed so as to be connected to an electrically conductive pattern such as the electrically conductive pattern 500 arranged on the wiring layer 115c. The plug 120 can be made of, for example, tungsten. Next, an electrically conductive film that includes a pad so as to be connected to the plug 120 is formed. The electrically conductive film 130 can be made of, for example, aluminum. Next, the microlenses 150 are formed in correspondence with the light waveguides WG. Each microlens 150 can be made of, for example, silicon nitride.

Next, in order to create an interface state between the semiconductor substrate 101 (silicon) and the silicon oxide film on the semiconductor substrate, an annealing process is performed in an atmosphere containing hydrogen gas. Hence, dangling bonds in the semiconductor substrate 101 (silicon) are terminated by hydrogen. This annealing process can be performed at, for example, a temperature of about 400° C. This annealing process adds heat stress to the semiconductor substrate 101. As a result, if the electrically conductive pattern 500 is not designed in compliance with the design rules (to be described later), the diffusion preventive film 114c can peel starting from the interface, between the diffusion preventive film 114c and the electrically conductive pattern 500 of the wiring layer 115c, whose adhesiveness has degraded, as exemplified in a sectional view CS7.

Particles are generated by the peeling of the diffusion preventive film 114c, and this can reduce the yield of the solid-state image sensor 1001 in the wafer. Furthermore, when the electrically conductive pattern 500 under the diffusion preventive film 114c is exposed, the manufacturing apparatus can become contaminated by the material forming the electrically conductive pattern 500. The restrictions and the design standards to be described below are advantageous for solving such problems.

First Embodiment

The first embodiment of the present invention will be described below. An electrically conductive pattern 500 exemplified in FIG. 3A can be arranged on a wiring layer 115 of a solid-state image sensor 1001 exemplified in FIGS. 1 and 2, for example, on the wiring layers 115 of a peripheral circuit 104. Here, the electrically conductive pattern 500 can be arranged on, among the plurality of wiring layers 115a to 115c, at least the uppermost wiring layer 115c. The electrically conductive pattern 500 can be a pattern to which a fixed voltage (for example, a power supply voltage or a ground voltage) is applied, but may also be a pattern applied to a signal line.

An evaluation result of a reduction in yield due to peeling of a diffusion preventive film 114c in a case in which the electrically conductive pattern 500 is arranged on the uppermost wiring layer 115c of the peripheral circuit 104 will be described hereinafter. Note that the peeling of the diffusion preventive film 114c can appear most conspicuously when the electrically conductive pattern 500 is arranged on the uppermost wiring layer 115c among the wiring layers 115a to 115c. Hence, in a case in which the electrically conductive pattern 500 is arranged on the wiring layer 115a or 115b that is below the uppermost wiring layer 115c, higher yield can be obtained than the yield to be described below.

Figure 3B:
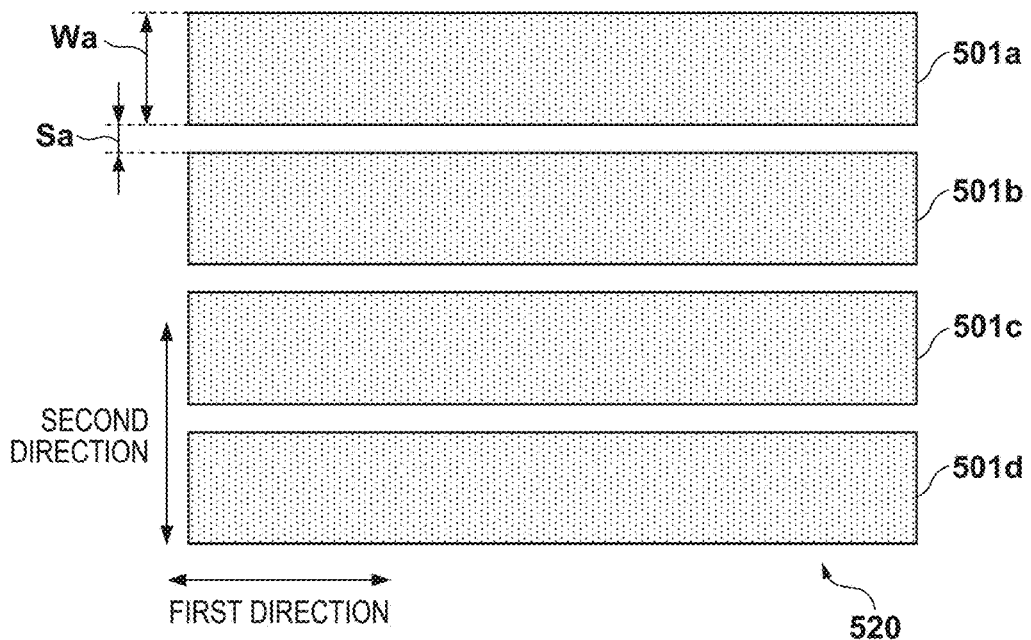
FIG. 3B is a view schematically showing an electrically conductive pattern for a preliminary experiment.
Figure 4B:
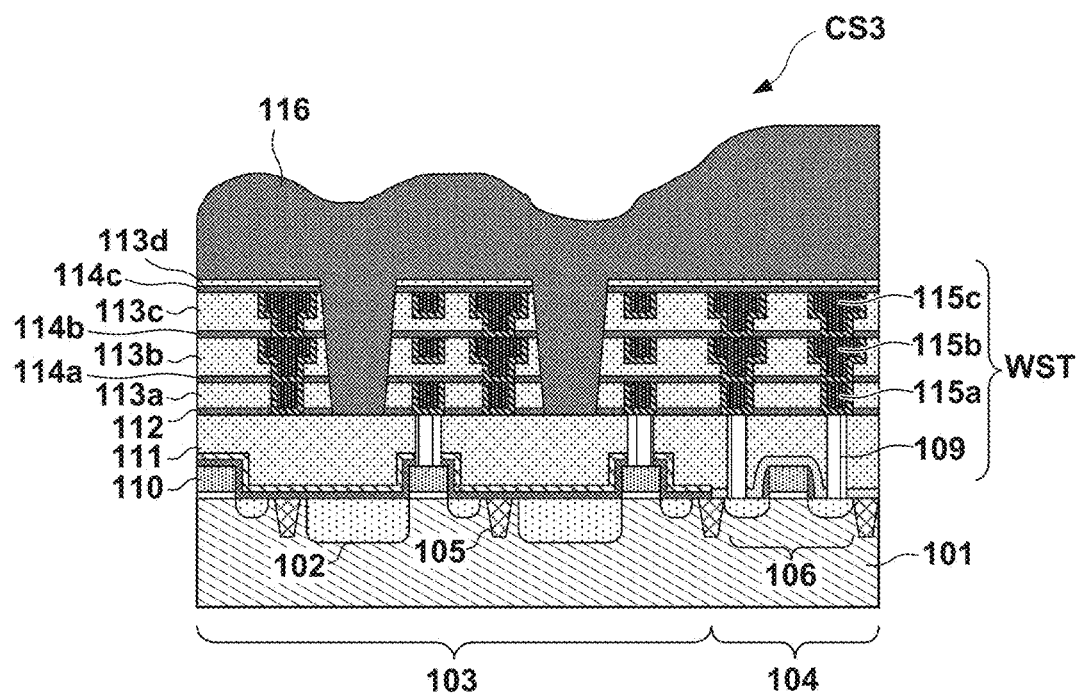
FIG. 4B is a schematic sectional view showing the structure and the manufacturing method of the solid-state image sensor.
Figure 4B:
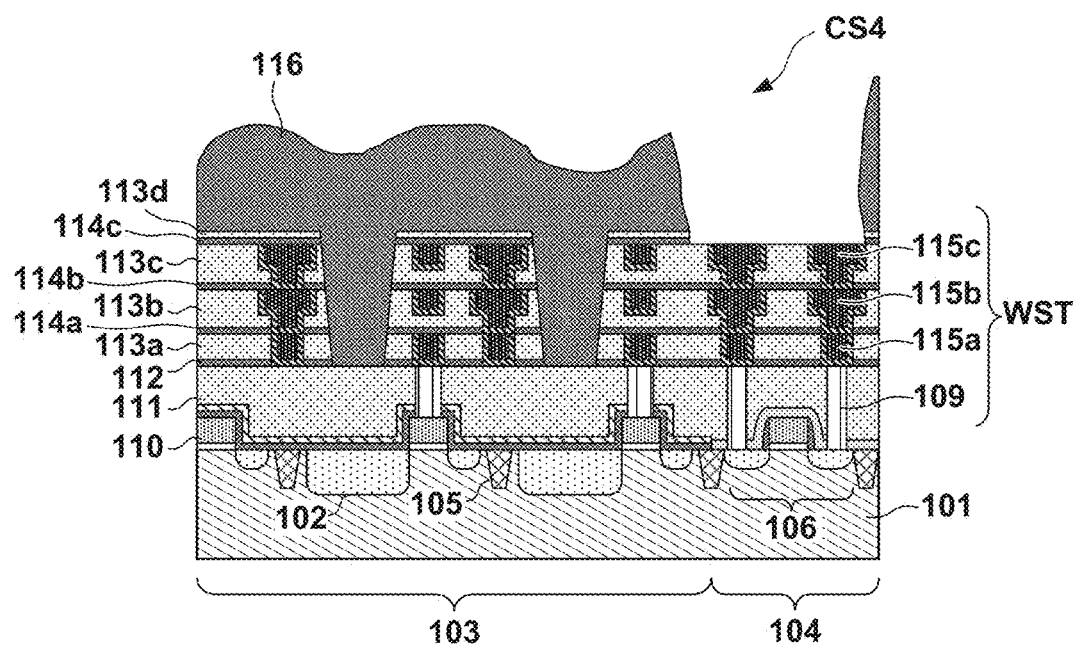
Figure 4C:
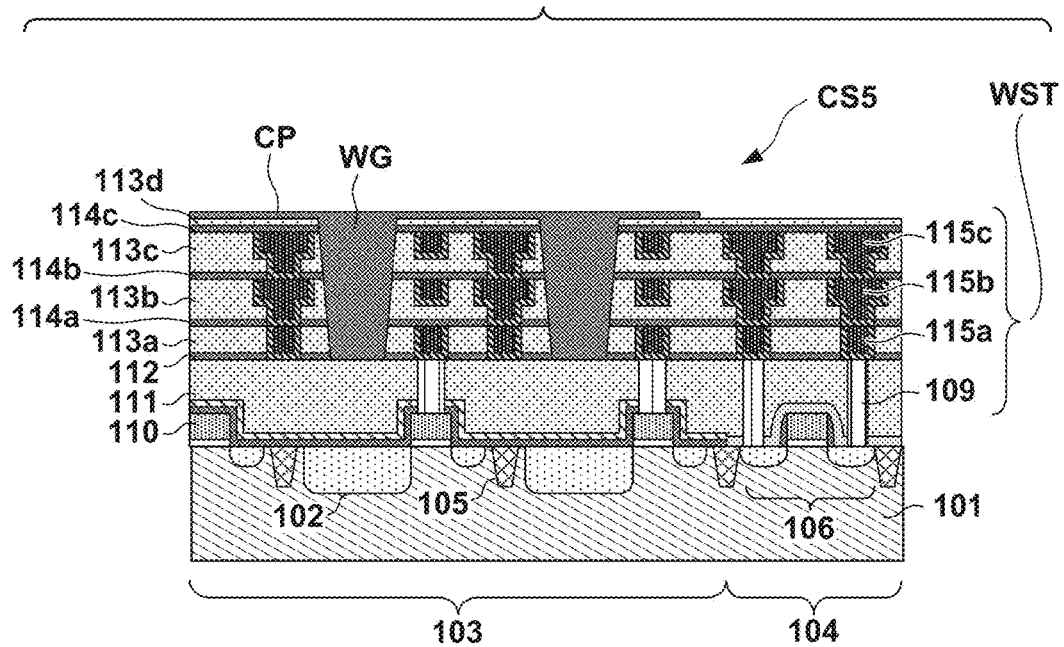
FIG. 4C is a schematic sectional view showing the structure and the manufacturing method of the solid-state image sensor.
Figure 4C:
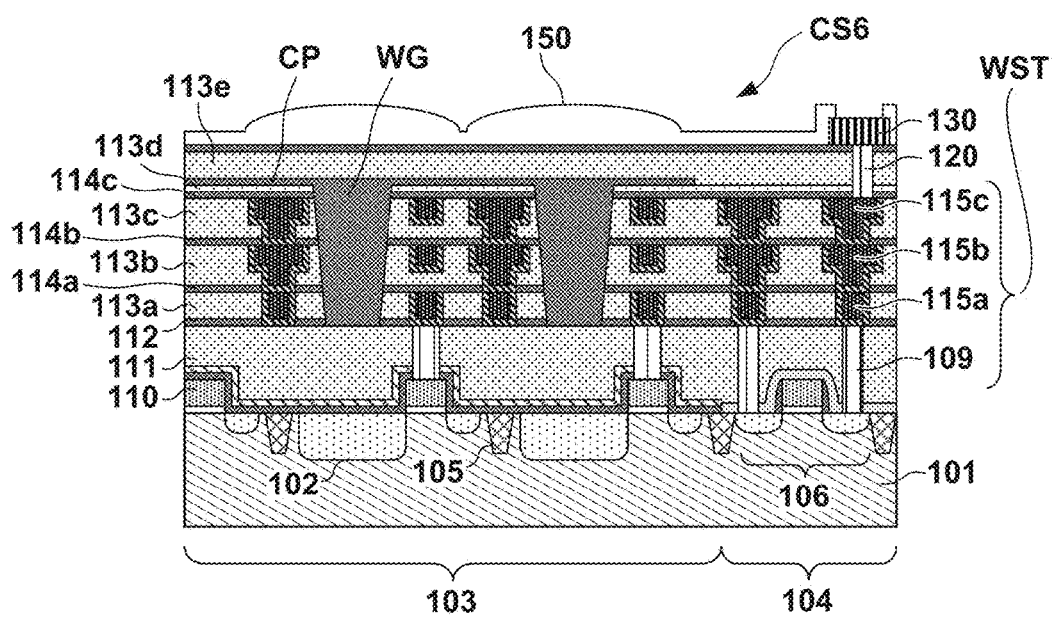
Figure 4D:
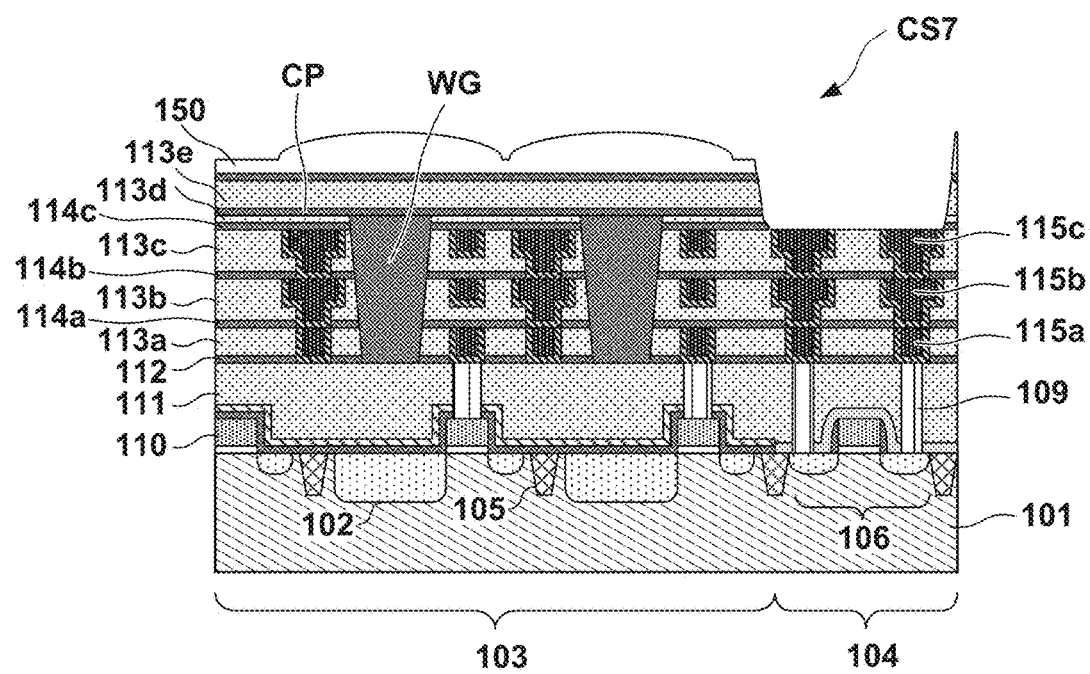
FIG. 4D is a schematic sectional view showing the structure and the manufacturing method of the solid-state image sensor.
Figure 5A:
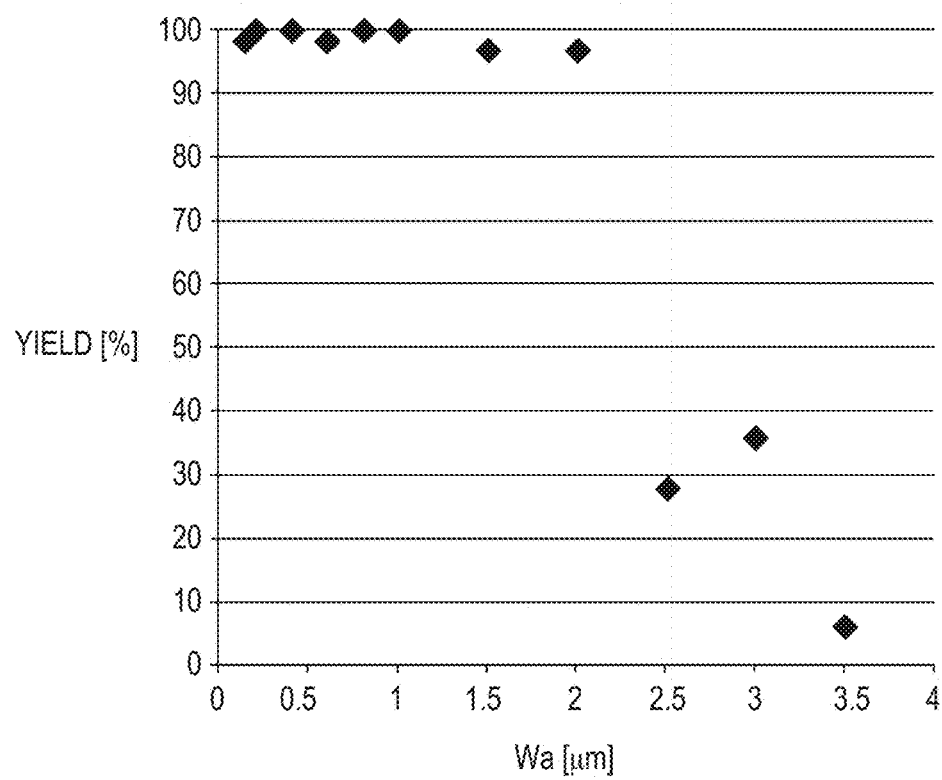
FIG. 5A is a chart showing an evaluation result of the relationship between the width of a primary line and a reduction in yield due to peeling of a diffusion preventive film.
Figure 5B:
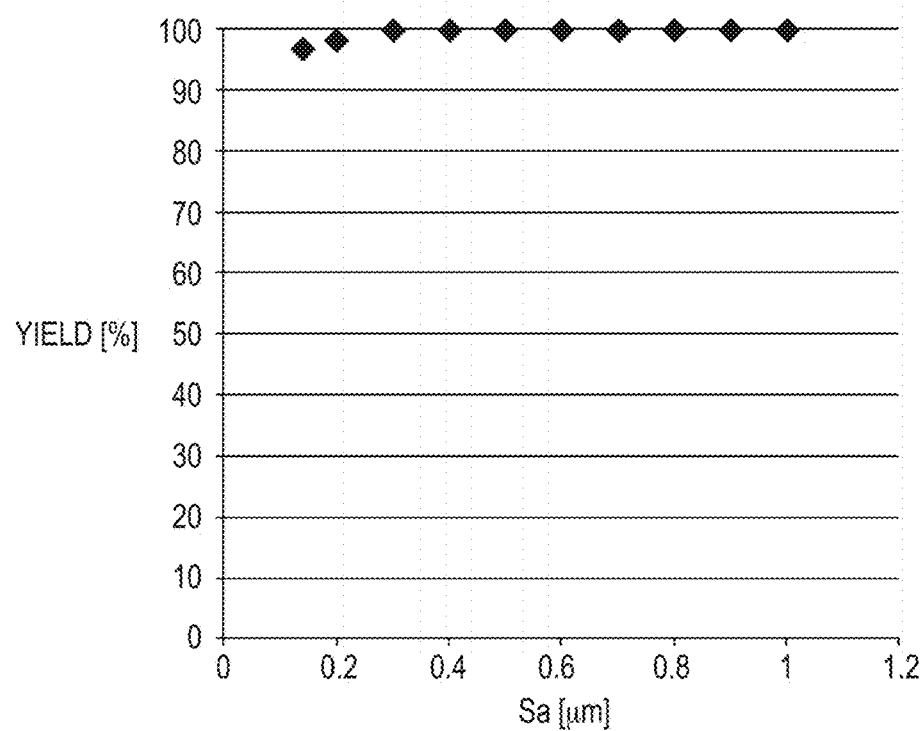
FIG. 5B is a chart showing an evaluation result of the relationship between the interval of the primary lines and the reduction in yield due to peeling of the diffusion preventive film.

First, as a preliminary experiment, an electrically conductive pattern 520 (an electrically conductive pattern without auxiliary lines 502) formed from only primary lines 501, as shown in FIG. 3B, is used to determine a preferable range between a width Wa of each primary line and an interval Sa of the primary lines 501. FIG. 5A shows an evaluation result of the relationship between the reduction in yield due to peeling of the diffusion preventive film 114c and the width Wa of each primary line 501 of the electrically conductive pattern 520 arranged on the wiring layer 115c. In this evaluation, the interval Sa between two adjacent primary lines 501 is determined to be 140 nm. FIG. 5B shows an evaluation result of the relationship between the reduction in yield due to peeling of the diffusion preventive film 114c and the interval Sa between the adjacent primary lines 501 in the electrically conductive pattern 520 arranged on the wiring layer 115c. In this evaluation, the width Wa of each primary line 501 is determined to be 2,000 nm. From the evaluation results of FIGS. 5A and 5B, it can be understood that the reduction in yield due to peeling of the diffusion preventive film 114c can be suppressed by setting the width Wa of each primary line 501 to be 250 nm (inclusive) and 2,000 nm (inclusive) (0.25 µm or more to 2 µm or less).

Figure 6:
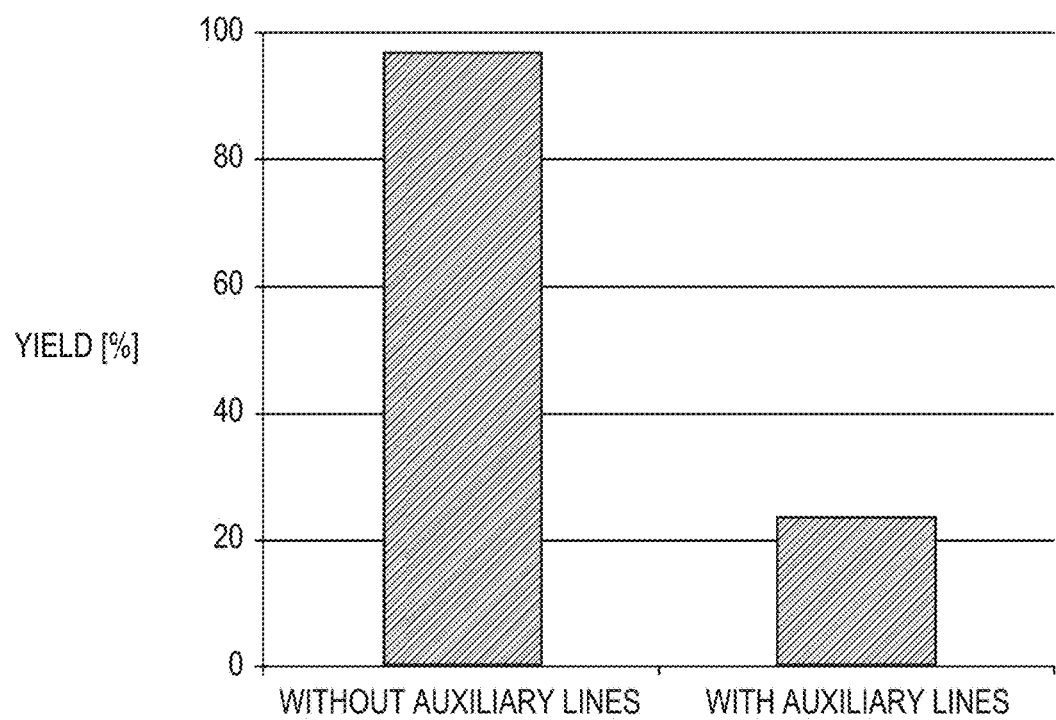
FIG. 6 is a chart showing an evaluation result of the reduction in yield due to peeling of the diffusion preventive film with respect to an electrically conductive pattern that does not include auxiliary lines and an electrically conductive pattern that includes the auxiliary lines.

FIG. 6 shows an evaluation result of the reduction in yield due to peeling of the diffusion preventive film 114c with respect to the electrically conductive pattern 520 (FIG. 3B) which does not include the auxiliary lines 502 and that with respect to the electrically conductive pattern 500 (FIG. 3A) which includes the auxiliary lines 502. In this evaluation result, the width Wa of each primary line 501 is set to 2,000 nm, and the interval Sa between the primary lines 501 is set to 140 nm. As exemplified in FIG. 3A, by arranging the plurality of auxiliary lines 502 between the adjacent primary lines 501, the electrically conductive pattern 500 with the auxiliary lines 502 have a plurality of slits 510 arranged so as to form broken lines. It can be understood that, compared to the electrically conductive pattern 520 without the auxiliary lines 502, the yield is significantly decreased in the electrically conductive pattern 500 with the auxiliary lines 502. This may be because the arrangement of the auxiliary lines 502 decreases the contact area between the interlayer insulation film 113c and the diffusion preventive film 114c while, on the other hand, increasing the contact area between the diffusion preventive film 114c and the auxiliary lines 502 whose adhesiveness is low. However, the resistance value of the electrically conductive pattern cannot be reduced without the arrangement of the auxiliary lines 502. That is, there is a problem in which arranging the auxiliary lines 502 leads to the reduction in yield due to the peeling of the diffusion preventive film 114c, while not arranging the auxiliary lines 502 fails to reduce the resistance value of the electrically conductive pattern.

Figure 7:
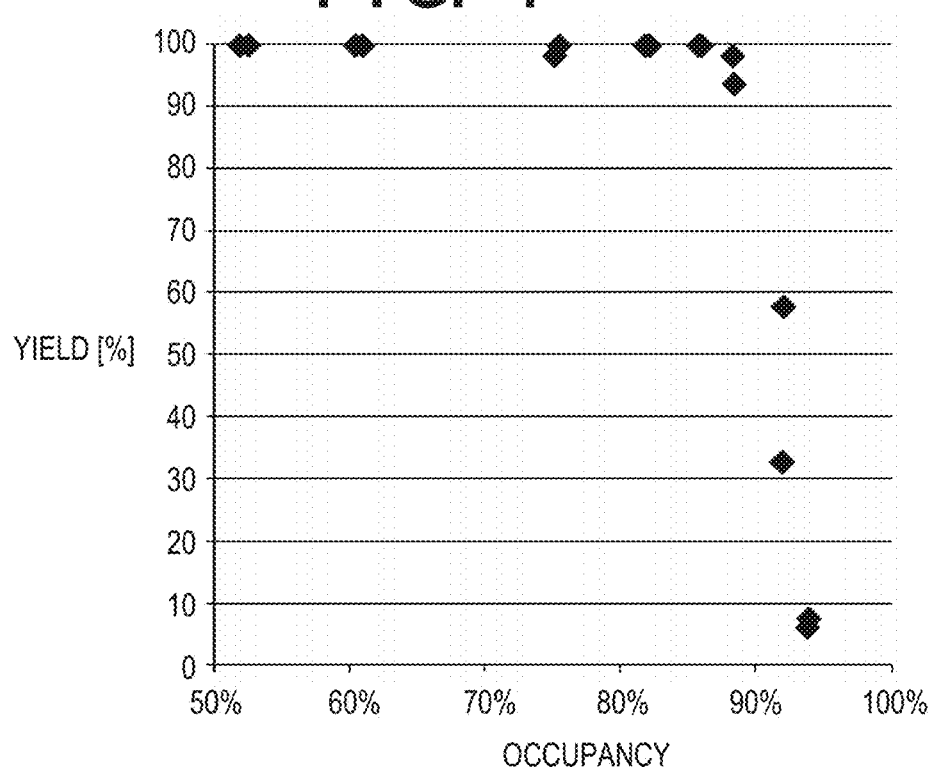
FIG. 7 is a chart showing an evaluation result, obtained under a condition in which the width of the auxiliary line is less than 400 nm, of the relationship between occupancy of the electrically conductive pattern and the reduction in yield due to peeling of the diffusion preventive film.

The present inventor has solved the above-described problem by optimizing the occupancy of the electrically conductive pattern 500. FIG. 7 shows an evaluation result of the relationship between the reduction in yield due to the peeling of diffusion preventive film 114c and an occupancy α of the electrically conductive pattern 500 under a condition in which a width Wb of each auxiliary line 502 is less than 400 nm. Note that the solid-state image sensor 1001 with a good yield represents that the solid-state image sensor 1001 has good reliability. The occupancy α(=AP/A) is defined as a value obtained by dividing an area AP of the electrically conductive pattern 500 in a square region 10, which is defined on the electrically conductive pattern 500 as described below, by an area A of the square region 10.

Here, the square region 10 is defined so that (a) the square region 10 has a first side 11 and a second side 12 parallel to the first direction, and (b) the plurality of primary lines 501 include a first line that overlaps the first side 11, a second line that overlaps the second side 12, and at least one line arranged between the first line and the second line, and (c) the square region 10 includes at least one auxiliary line 502. In the example shown in FIG. 3A, the primary line 501a is the first line overlapping the first side 11, the primary line 501d is the second line overlapping the second side 12, and the primary lines 501b and 501c are third lines arranged between the first line and the second line.

In other words, the square region 10 is defined so as to have the first side 11, which overlaps the first line and is parallel to the first direction, and the second side 12, which overlaps the second line and is parallel to the first direction, and include at least one of the plurality of auxiliary lines 502 in the square region 10.

In one example, the dimension of each side of the square region 10 can be 5,000 nm (inclusive) to 20,000 nm (inclusive). Also, in one example, the number of at least two lines (501b and 501c) arranged between the first line (501a) and the second line (501d) can fall within the range of 5 to 15 (for example, 10).

It can be understood from FIG. 7 that, in the viewpoint of suppressing the reduction in yield due to the arrangement of the auxiliary lines 502, it is preferable for the occupancy α to be 0.9 or less, and that it is further preferable for the occupancy α to be 0.85 or less. Additionally, in the viewpoint of reducing the resistance value of the electrically conductive pattern 500, the lower-limit value of the occupancy α is preferably a larger value and can be, for example, 0.33, 0.5, 0.6, 0.7, or 0.8. Here, the smaller the width Wb of each auxiliary line 502 is, the yield reduction can be suppressed. However, reducing the width Wb of each auxiliary line 502 can have a disadvantageous influence on the reduction of the resistance value of the electrically conductive pattern 500. Hence, in the viewpoint of reducing the resistance value of the electrically conductive pattern 500, the width Wb of each auxiliary line 502 can be 10 nm or more, preferably 50 nm or more, or even more preferably 100 nm or more.

In the evaluation shown in FIG. 7, the occupancy α can be changed by setting as various kinds of values the width Wa of each primary line 501, the interval Sa between the primary lines 501, the width Wb of each auxiliary line 502, and the interval between the auxiliary lines 502. Here, in the viewpoint of reducing the resistance value and the layout area of the electrically conductive pattern 500, it is preferable for the width Wa of each primary line 501 to be 250 nm (inclusive) to 2,000 nm (inclusive) and is more preferable for the width Wa to be 400 nm (inclusive) to 2,000 nm (inclusive). Also, in the viewpoint of reducing the resistance value of the electrically conductive pattern 500 while suppressing reduction in yield due to the peeling of the diffusion preventive film 114c, the width Wa of each of the plurality of primary lines 501 is preferably larger than the width Wb of each of the plurality of auxiliary lines 502.

Also, in the viewpoint of suppressing the reduction in yield due to peeling of the diffusion preventive film 114c while reducing the layout area, it is preferable for the interval Sa between the primary lines 501 to be 140 nm (inclusive) to 500 nm (inclusive).

Furthermore, in the viewpoint of reducing the resistance value of the electrically conductive pattern 500 while suppressing the reduction in yield due to the peeling of the diffusion preventive film 114c, it is preferable for the area of each slit 510 to be 560,000 $nm^2$ (inclusive) to 2,000,000 $nm^2$ (inclusive). Here, the slit 510 is a portion surrounded by arbitrary adjacent primary lines 501 of the plurality of primary lines 501 and arbitrary adjacent auxiliary lines 502 of the plurality of auxiliary lines 502. The number of the plurality of primary lines 501 in the electrically conductive pattern 500 can be 12 or more.

The electrically conductive pattern 500 can include a plug (for example, a plug 120) connected to one of the plurality of primary lines 501 and the plurality of auxiliary lines 502. The electrically conductive pattern 500 can be connected, via the plug, to an electrically conductive body such as a pad and/or the wiring layers arranged below and/or above the electrically conductive pattern 500.

Second Embodiment

Figure 8:
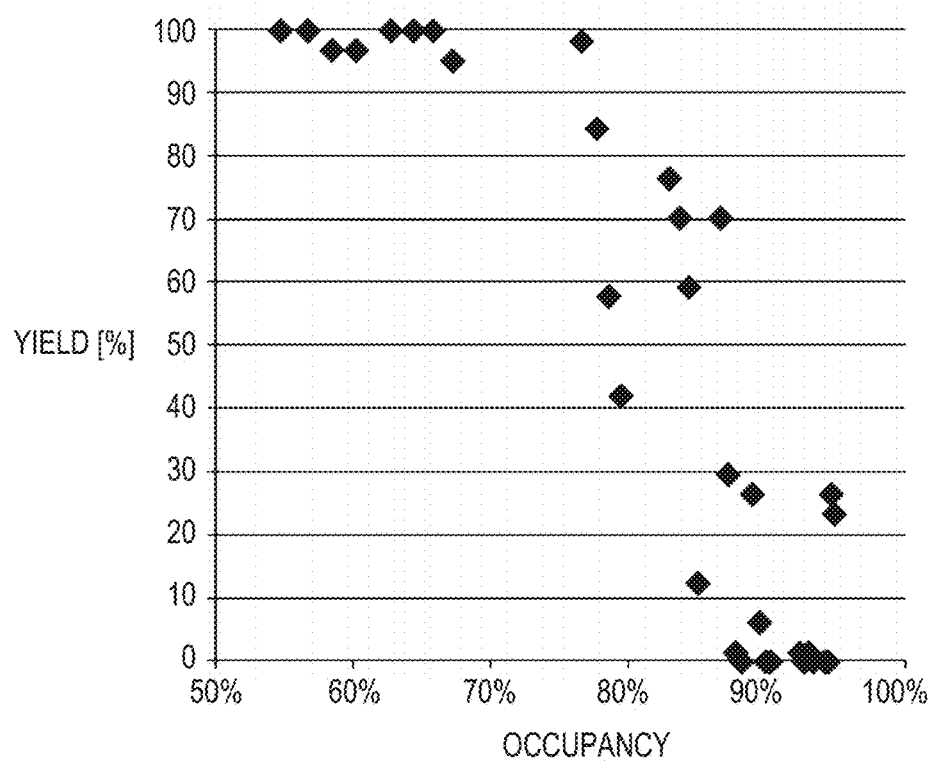
FIG. 8 is a chart showing an evaluation result, obtained under a condition in which the width of an auxiliary line is 400 nm (inclusive) to 2,000 nm (inclusive), of the relationship between the occupancy of an electrically conductive pattern and the reduction in yield due to peeling of a diffusion preventive film.

The second embodiment of the present invention will be described below. Note that matters not mentioned in the second embodiment can follow those in the first embodiment. FIG. 8 shows an evaluation result of a relationship between reduction in yield due to peeling of a diffusion preventive film 114c and an occupancy α of the electrically conductive pattern 500 under a condition in which a width Wb of each auxiliary line 502 is 400 nm (inclusive) to 2,000 nm (inclusive). It can be understood from FIG. 8 that, in order to suppress the reduction in yield due to the arrangement of the auxiliary lines 502, it is preferable for the occupancy α to be 0.75 or less, and more preferably, 0.73 or less. Also, in the viewpoint of reducing the resistance value of the electrically conductive pattern 500, it is preferable to set a larger value as the lower-limit value of the occupancy α, and the lower-limit value can be, for example, 0.33, 0.5, 0.6, or 0.7.

In the evaluation shown in FIG. 8, the occupancy α is changed by setting as various kinds of values a width Wa of each primary line 501, an interval Sa between the primary lines 501, a width Wb of each auxiliary line 502, and an interval between the auxiliary lines 502. Here, in the viewpoint of reducing the resistance value of the electrically conductive pattern 500 and a layout area, it is preferable for the width Wa of each primary line 501 to be 250 nm (inclusive) to 2,000 nm (inclusive) and is more preferable for the width Wa to be 400 nm (inclusive) to 2,000 nm (inclusive). Also, in the viewpoint of reducing the resistance value of the electrically conductive pattern 500 while suppressing reduction in yield due to the peeling of the diffusion preventive film 114c, the width Wa of each of the plurality of primary lines 501 is preferably larger than the width Wb of each of the plurality of auxiliary lines 502.

Also, in the viewpoint of suppressing the reduction in yield due to peeling of the diffusion preventive film 114c while reducing the layout area, it is preferable for the interval Sa between the primary lines 501 to be 140 nm (inclusive) to 500 nm (inclusive).

Furthermore, in the viewpoint of reducing the resistance value of the electrically conductive pattern 500 while suppressing the reduction in yield due to the peeling of the diffusion preventive film 114c, it is preferable for the area of each slit 510 to be 560,000 nm$^2$ (inclusive) to 2,000,000 nm$^2$ (inclusive). Here, the slit 510 is a portion surrounded by arbitrary adjacent primary lines 501 of the plurality of primary lines 501 and arbitrary adjacent auxiliary lines 502.

Third Embodiment

Figure 9:
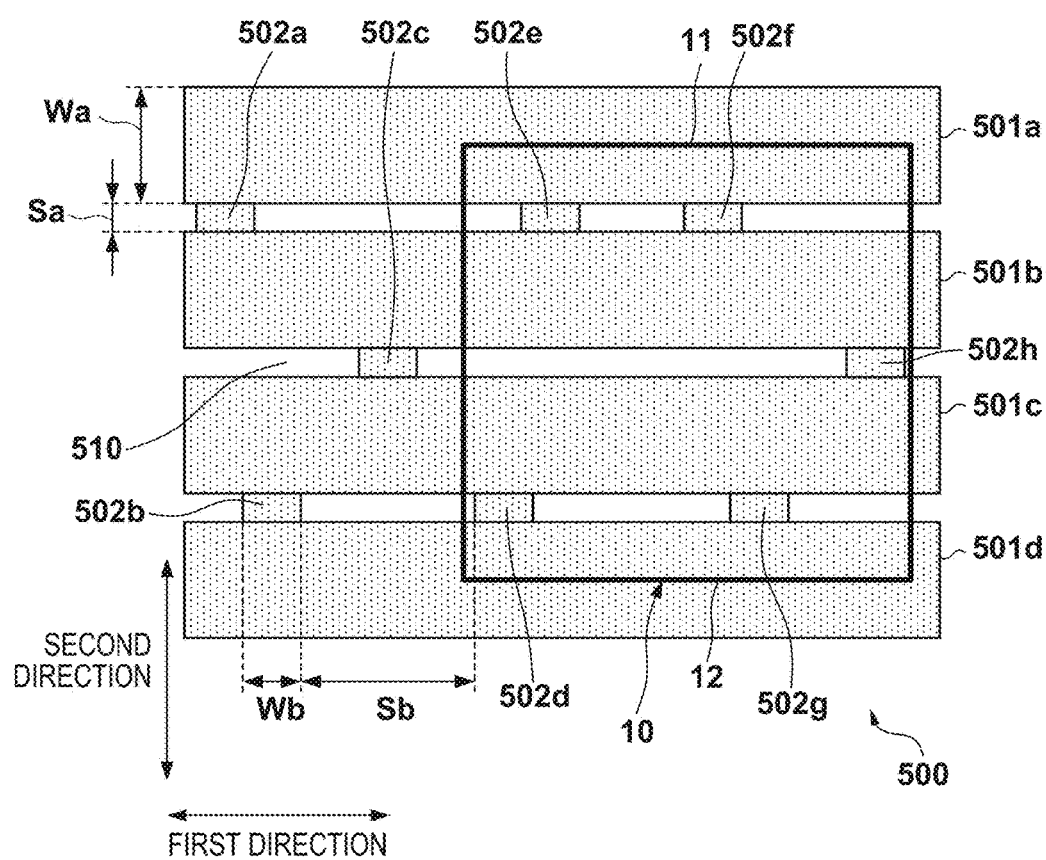
FIG. 9 is a view showing the arrangement of an electrically conductive pattern according to the third embodiment of the present invention.

In the third embodiment, the arrangement of an electrically conductive pattern 500 differs from those in the first and second embodiments. FIG. 9 shows the electrically conductive pattern 500 according to the third embodiment of the present invention. Note that matters not mentioned in the third embodiment can follow those in the first or the second embodiment.

In the third embodiment, a plurality of auxiliary lines 502 include auxiliary lines each extending in parallel to a second direction so as to connect at least two primary lines of the plurality of primary lines 501 to each other while not connecting other primary lines. For example, although the auxiliary lines 502a, 502e, and 502f connect the primary line 501a and the primary line 501b to each other, the auxiliary lines 502a, 502e, and 502f extend parallel to the second direction so as not to connect the other primary lines 501c and 501d to each other. In addition, although the auxiliary lines 502b, 502d, and 502g connect the primary line 501c and the primary line 501d to each other, the auxiliary lines 502b, 502d, and 502g extend parallel to the second direction so as not to connect the other primary lines 501a and 501b to each other.

In another viewpoint, the plurality of auxiliary lines 502 include first auxiliary lines, by which primary lines forming a first group among the plurality of primary lines 501 are connected to each other, and second auxiliary lines, by which primary lines forming a second group of the plurality of primary lines 501 are connected to each other. For example, the primary lines 501a and 501b form the first group, and the auxiliary lines 502a, 502e, and 502f are the first auxiliary lines by which the primary lines 501a and 501b forming the first group are connected to each other. The primary lines 501b and 501c form the second group, and the auxiliary line 502c is the second auxiliary line by which the primary lines 501b and 501c forming the second group are connected to each other. Here, at least some of the primary lines 501 forming the first group differ from the primary lines 501 forming the second group, and the positions of the respective first auxiliary lines in the first direction differ from the positions of the respective second auxiliary lines in the first direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-085612, filed Apr. 24, 2017, which is hereby incorporated by reference herein in its entirety.

What is claimed is:

1. A solid-state image sensor that includes a pixel array having a plurality of pixels, and a peripheral circuit which is arranged on a periphery of the pixel array, the sensor comprising:
   a semiconductor substrate that includes an element forming the pixel array and an element forming the peripheral circuit; and
   a wiring structure that is arranged on the semiconductor substrate,
   wherein the wiring structure includes an electrically conductive pattern arranged in a trench of an interlayer insulation film, the electrically conductive pattern includes a plurality of primary lines parallel to a first direction and a plurality of auxiliary lines connecting the plurality of primary lines to each other,
   a width of each of the plurality of primary lines in a second direction perpendicular to the first direction is not less than 250 nm and not more than 2,000 nm,
   an interval between adjacent primary lines of the plurality of primary lines is not more than 500 nm,
   a width of each of the plurality of auxiliary lines in the first direction is less than 400 nm,
   the plurality of primary lines include a first line, a second line, and a third line which is arranged between the first line and the second line,
   a square region, having a first side which is parallel to the first direction and overlaps the first line and a second side which is parallel to the first direction and overlaps the second line, is defined so as to include at least one of the plurality of auxiliary lines in the square region, and a value obtained by dividing an area of the electrically conductive pattern in the square region by an area of the square region is not more than 0.9.

2. The sensor according to claim 1, wherein the width of each of the plurality of primary lines in the second direction is larger than the width of each of the plurality of auxiliary lines in the first direction.

3. The sensor according to claim 1, wherein the width of each of the plurality of primary lines is not less than 400 nm.

4. The sensor according to claim 1, wherein the interval between the adjacent primary lines of the plurality of primary lines is not less than 140 nm and not more than 500 nm.

5. The sensor according to claim 1, wherein an area of a portion surrounded by arbitrary adjacent primary lines of the plurality of primary lines and arbitrary adjacent auxiliary lines of the plurality of auxiliary lines is not less than 560,000 nm$^2$ and not more than 2,000,000 nm$^2$.

6. The sensor according to claim 1, wherein the number of the plurality of primary lines in the electrically conductive pattern is not less than 12.

7. The sensor according to claim 1, wherein the wiring structure includes a plurality of wiring layers and the electrically conductive pattern is arranged on an uppermost wiring layer of the plurality of wiring layers.

8. The sensor according to claim 7, wherein the electrically conductive pattern is a wiring layer mainly containing copper.

9. The sensor according to claim 8, wherein the wiring structure also includes, on the electrically conductive pattern, a layer containing at least one of silicon carbide (SiC) and silicon oxycarbide (SiOC).

10. The sensor according to claim 9, wherein the wiring structure includes an insulation film on the layer containing at least one of silicon carbide (SiC) and silicon oxycarbide (SiOC), and a thickness of the insulation film is not more than 500 nm.

11. The sensor according to claim 1, wherein the element forming the pixel array includes a photoelectric converter, and the wiring structure includes a light waveguide arranged on the photoelectric converter.

12. The sensor according to claim 11, wherein a portion extending from the light waveguide and made of the same material as the light waveguide is present on the wiring structure.

13. The sensor according to claim 12, wherein the wiring structure does not include a light waveguide arranged on the peripheral circuit.

14. The sensor according to claim 12, wherein the portion extending from the light waveguide is not present on the electrically conductive pattern.

15. The sensor according to claim 11, wherein the light waveguide contains a material selected from the group consisting of silicon nitride and silicon oxide.

16. The sensor according to claim 1, wherein the interlayer insulation film contains a material selected from the group consisting of silicon oxide and silicon oxycarbide.

17. The sensor according to claim 1, wherein the electrically conductive pattern includes a plug connected to one of the plurality of primary lines and the plurality of auxiliary lines.

18. The sensor according to claim 1, wherein the plurality of auxiliary lines include an auxiliary line extending parallel to the second direction so as to connect at least two primary lines of the plurality of primary lines to each other and so as not to connect the other primary lines to each other.

19. The sensor according to claim 1, wherein the plurality of auxiliary lines include a first auxiliary line, by which primary lines that form a first group of the plurality of primary lines are connected to each other, and a second auxiliary line, by which primary lines that form a second group of the plurality of primary lines are connected to each other, at least some of the primary lines that form the first group are different from the primary lines that form the second group, and a position of the first auxiliary line in the first direction and a position of the second auxiliary line in the first direction are different from each other.

20. The sensor according to claim 1, wherein the electrically conductive pattern is a pattern on which fixed voltage is applied.

21. The sensor according to claim 1, wherein the electrically conductive pattern is arranged on the peripheral circuit.

22. A camera comprising:
a solid-state image sensor defined in claim 1; and
a processor configured to process a signal output from the solid-state image sensor.

23. A solid-state image sensor that includes a pixel array which includes a plurality of pixels and a peripheral circuit which is arranged on a periphery of the pixel array, comprising:
a semiconductor substrate that includes an element forming the pixel array and an element forming the peripheral circuit; and
a wiring structure that is arranged on the semiconductor substrate,
wherein the wiring structure includes an electrically conductive pattern arranged in a trench of an interlayer insulation film, the electrically conductive pattern includes a plurality of primary lines parallel to a first direction and a plurality of auxiliary lines connecting the plurality of primary lines to each other, a width of each of the plurality of primary lines in a second direction perpendicular to the first direction is larger than a width of each of the plurality of auxiliary lines in the first direction,
the width of each of the plurality of primary lines in the second direction is not less than 250 nm and not more than 2,000 nm,
the width of each of the plurality of auxiliary lines in the first direction is not less than 400 nm and not more than 2,000 nm,
the plurality of primary lines include a first line, a second line, and a third line which is arranged between the first line and the second line,
a square region, having a first side which is parallel to the first direction and overlaps with the first line and a second side which is parallel to the first direction and overlaps the second line, is defined so as to include at least one of the plurality of auxiliary lines in the square region, and
a value obtained by dividing an area of the electrically conductive pattern in the square region by an area of the square region is not more than 0.75.

* * * * *